(12) United States Patent
Silverstein

(10) Patent No.: US 8,502,898 B2
(45) Date of Patent: Aug. 6, 2013

(54) METHOD, APPARATUS, AND SYSTEM PROVIDING A RECTILINEAR PIXEL GRID WITH RADIALLY SCALED PIXELS

(75) Inventor: Amnon Silverstein, Mountain View, CA (US)

(73) Assignee: Micron Technology, Inc., Boise, ID (US)

( * ) Notice: Subject to any disclaimer, the term of this patent is extended or adjusted under 35 U.S.C. 154(b) by 1095 days.

(21) Appl. No.: 11/739,010

(22) Filed: Apr. 23, 2007

(65) Prior Publication Data
US 2008/0259194 A1 Oct. 23, 2008

(51) Int. Cl.
*H04N 3/14* (2006.01)
*H04N 5/335* (2006.01)

(52) U.S. Cl.
USPC ............................................. 348/302; 348/315

(58) Field of Classification Search
USPC ....... 348/315, 251, 241, 311, 302; 250/208.1
See application file for complete search history.

(56) References Cited

U.S. PATENT DOCUMENTS

| | | | |
|---|---|---|---|
| 6,140,630 A | 10/2000 | Rhodes | |
| 6,204,524 B1 | 3/2001 | Rhodes | |
| 6,310,366 B1 | 10/2001 | Rhodes et al. | |
| 6,326,652 B1 | 12/2001 | Rhodes | |
| 6,333,205 B1 | 12/2001 | Rhodes | |
| 6,376,868 B1 | 4/2002 | Rhodes | |
| 6,563,101 B1 * | 5/2003 | Tullis | 250/208.1 |
| 6,738,057 B1 | 5/2004 | Campbell | |
| 6,980,244 B1 * | 12/2005 | Yonemoto et al. | 348/302 |
| 7,106,374 B1 * | 9/2006 | Bandera et al. | 348/308 |
| 7,227,573 B2 * | 6/2007 | Stavely | 348/240.2 |
| 2004/0017492 A1 * | 1/2004 | Stavely | 348/240.2 |
| 2004/0246479 A1 | 12/2004 | Cartlidge et al. | |
| 2006/0033005 A1 | 2/2006 | Jerdev et al. | |
| 2006/0158582 A1 | 7/2006 | Hwang | |

FOREIGN PATENT DOCUMENTS

| | | |
|---|---|---|
| JP | 2004-64796 A | 2/2004 |
| JP | 2005-115598 A | 4/2005 |
| JP | 2006-107332 A | 4/2006 |
| JP | 2006-149634 A | 6/2006 |

OTHER PUBLICATIONS

International Search Report and Written Opinion dated Jul. 24, 2008 issued in PCT/2008/060185.

* cited by examiner

*Primary Examiner* — Nicholas Giles
(74) *Attorney, Agent, or Firm* — Dickstein Shapiro LLP

(57) ABSTRACT

Pixels in an imaging device pixel array are sized according to their geographic location in the pixel array to compensate for various optical characteristics/issues. In one example, pixel size is increased according to the distance of the pixel from the x-axis and/or the y-axis of the pixel array to correct for lens shading.

18 Claims, 9 Drawing Sheets

METHOD, APPARATUS, AND SYSTEM PROVIDING A RECTILINEAR PIXEL GRID WITH RADIALLY SCALED PIXELS

FIELD OF THE INVENTION

Generally, embodiments disclosed herein relate to adjusting the outputted signals of imaging pixels according to their geographic location in a pixel array to compensate for various optical problems.

BACKGROUND

A CMOS imager circuit includes a focal plane array of pixels, each one of the pixels including a photosensor, for example, a photogate, photoconductor or a photodiode overlying a substrate for accumulating photo-generated charge in the underlying portion of the substrate. Each pixel has a readout circuit that includes at least an output field effect transistor formed in the substrate and a charge storage region formed on the substrate connected to the gate of an output transistor. The charge storage region may be constructed as a floating diffusion region. Each pixel may include at least one electronic device such as a transistor for transferring charge from the photosensor to the storage region and one device, also typically a transistor, for resetting the storage region to a predetermined charge level prior to charge transference.

In a CMOS imager, the active elements of a pixel perform the necessary functions of: (1) photon to charge conversion; (2) accumulation of image charge; (3) resetting the storage region to a known state before the transfer of charge to it; (4) transfer of charge to the storage region accompanied by charge amplification; (5) selection of a pixel for readout; and (6) output and amplification of a signal representing pixel charge. Photo charge may be amplified when it moves from the initial charge accumulation region to the storage region. The charge at the storage region is typically converted to a pixel output voltage by a source follower output transistor.

FIG. 1 shows a top down view of an individual four-transistor (4T) pixel 10 of a CMOS imaging device. A pixel 10 generally comprises a transfer gate 50 for transferring photoelectric charges generated in a photosensor 21 (shown as a pinned photodiode) to a floating diffusion region FD acting as a sensing node, which is in turn, electrically connected to the gate 60 of an output source follower transistor. A reset gate 40 is provided for resetting the floating diffusion region FD to a predetermined voltage in order to sense a next signal, and a row select gate 80 is provided for outputting a signal from the source follower transistor to an output terminal in response to a pixel row select signal. The various transistors are coupled to each other via their source/drain regions 22 and coupled to other elements of the imaging device via the contacts 32.

CMOS imagers of the type discussed above are generally known as discussed, for example, in U.S. Pat. Nos. 6,140,630, 6,376,868, 6,310,366, 6,326,652, 6,204,524 and 6,333,205, assigned to Micron Technology, Inc., which are hereby incorporated by reference in their entirety.

FIG. 2 shows a grid layout for a conventional pixel array 100 in which all of the pixels and their respective photosensors are identically sized. Because the pixels are identically sized and spaced, the lines connecting the pixels to circuitry (not shown) located on the periphery of the pixel array 100 may also be identically spaced. It is known that pixels in various spatial locations in the pixel array 100 have different levels of output signals for the same level of light illumination. Optical image formation is not spatially shift invariant; that is, more light is transmitted to pixels located in-line with the optical axis, such as pixels 102 located at or near the center of the pixel array 100, than is transmitted to pixels 104 not in-line with the optical axis. In general, pixels may experience a cosine roll off in incident light intensity the greater their distance from the optical axis. Therefore, pixels located out of line with the optical axis, such as corner pixels 104, will receive less light than pixels located directly in-line with the optical axis, such as center pixels 102. This phenomenon is known in the art as lens shading and may cause an image generated by the pixel array 100 to be noticeably darker in the corners than in the center.

FIG. 3 shows, by shading, the amount of light captured and displayed as brightness by each of the pixels in the pixel array shown in FIG. 2. The darker shading indicates less light being captured by the pixels farther away from the center of the pixel array than pixels closer to the center of the pixel array.

Conventional CMOS imaging devices have attempted to correct lens shading during post-processing of already-acquired image data or during image acquisition (i.e., as the image is read out from the imaging device). There is a need and desire in the art for additional image correction methods that do not require post-readout image processing or special image acquisition techniques to compensate for lens shading.

DETAILED DESCRIPTION

In the following detailed description, reference is made to the accompanying drawings which form a part hereof, and in which are shown by way of illustration of specific embodiments in which the invention may be practiced. These embodiments are described in sufficient detail to enable those of ordinary skill in the art to make and use them, and it is to be understood that structural, logical or procedural changes may be made to the specific embodiments disclosed herein.

Various embodiments described herein modify the size of pixel photosensors according to their spatial location in a pixel array to compensate for different spatial output signal levels. The embodiments described can thus correct for spatial optical effects such as lens shading, as well as other spatial optical effects.

As discussed above, pixels located farther away from the optical axis of a lens in an imaging device may experience decreased light intensity, for example, caused by lens shading. One embodiment herein mitigates against this by increasing the size of the pixel, and thus the size of the photosensor, according to the pixel's geographical distance form the optical axis in the pixel array.

Figure 1:
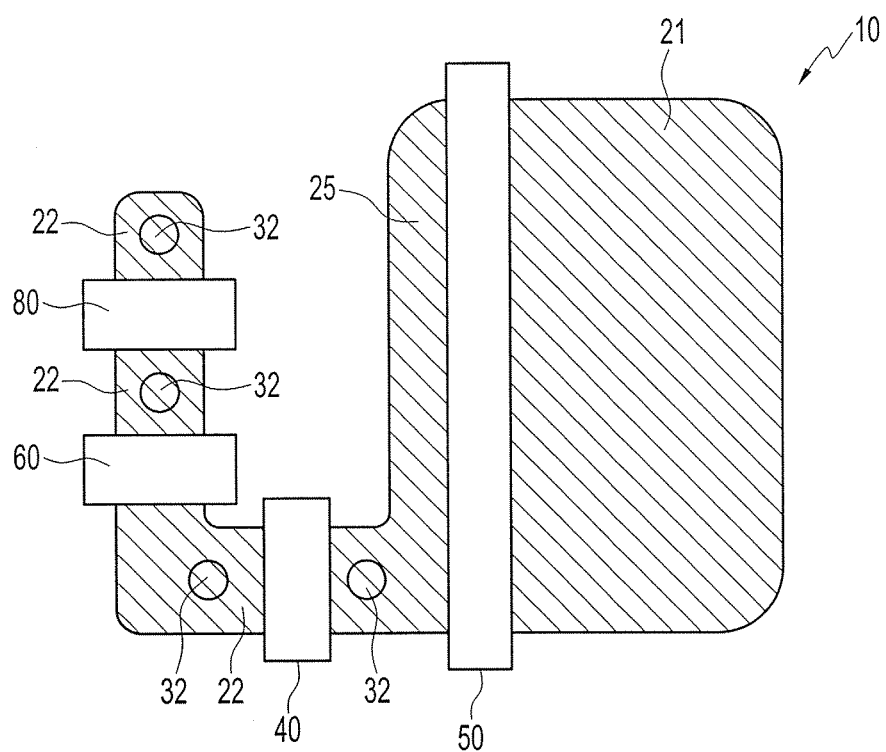
FIG. 1 shows a top down view of a pixel of a CMOS imaging device.
Figure 2:
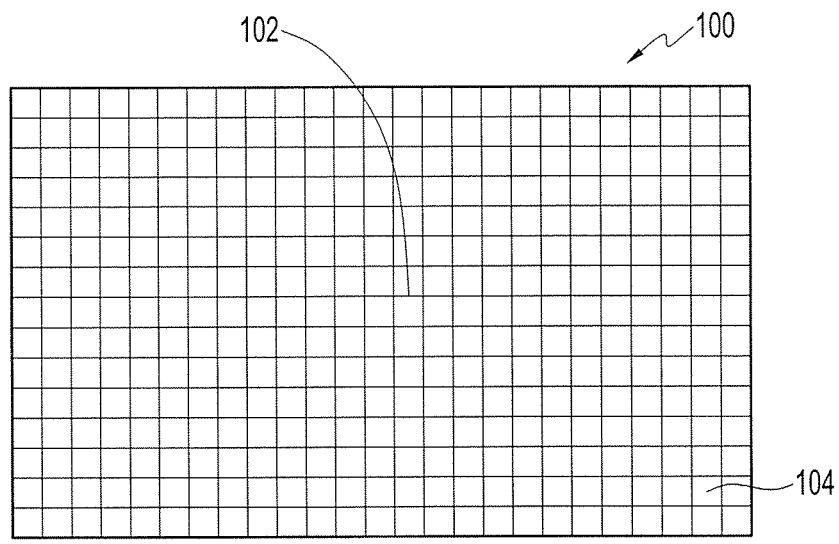
FIG. 2 shows a grid for a conventional pixel array.
Figure 3:
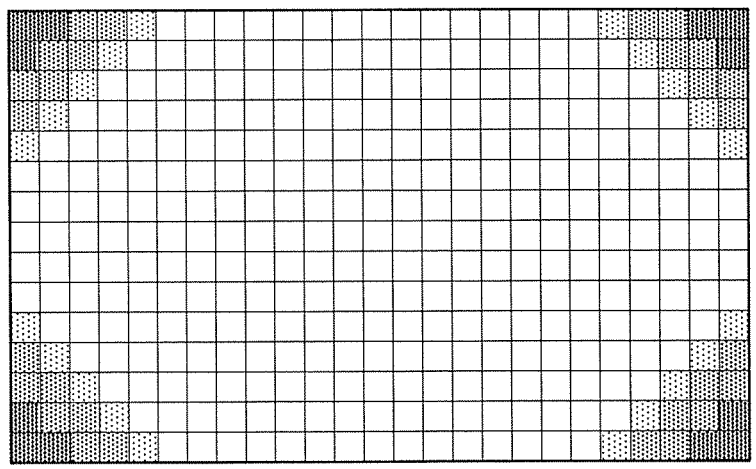
FIG. 3 depicts the amount of light captured and displayed by the pixels of the pixel array of FIG. 2.
Figure 4:
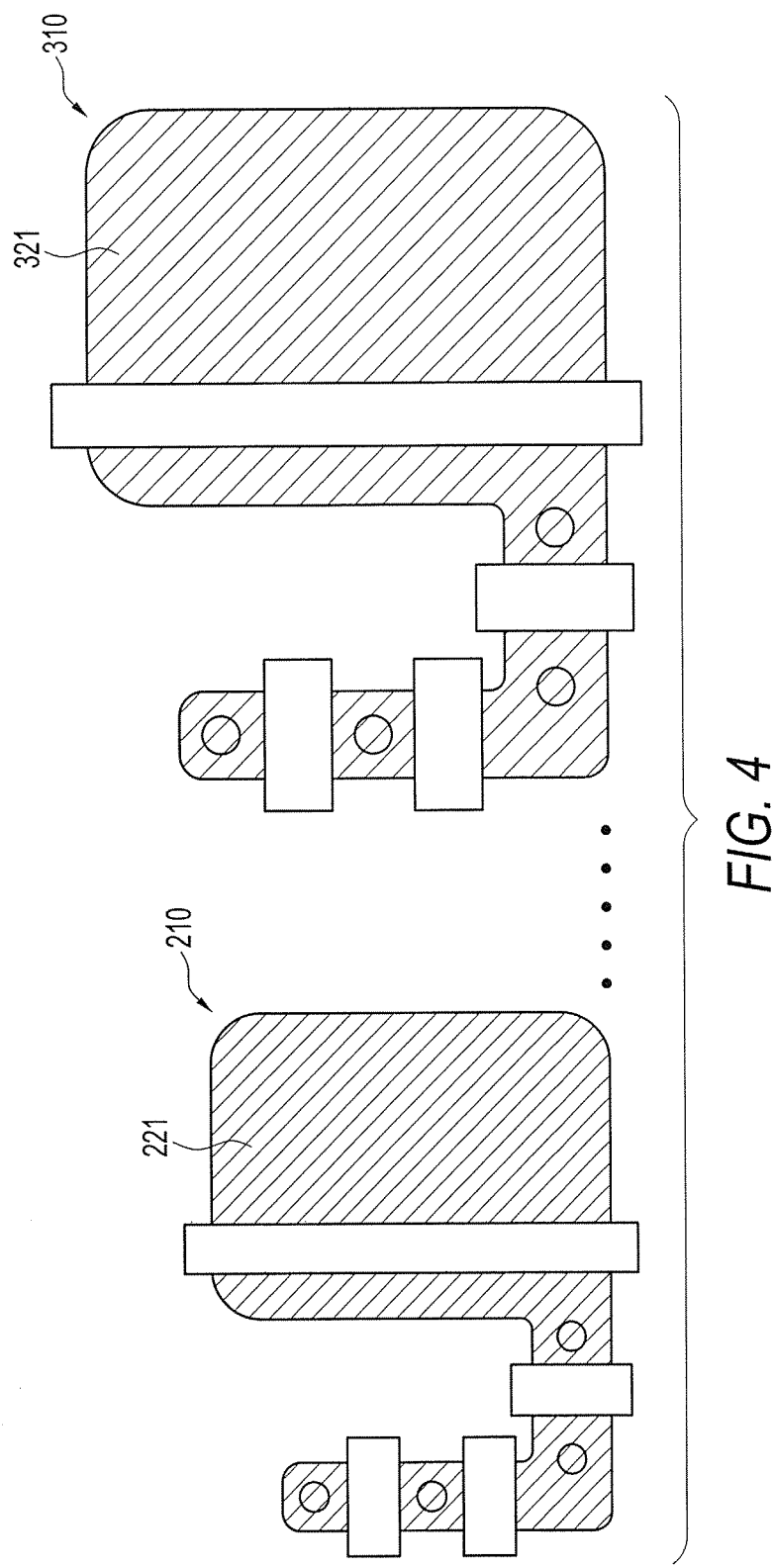
FIG. 4 shows a top down view of pixels of various sizes according to an embodiment described herein.

Although this disclosure refers to modifying pixel size, it is to be understood that what is most important is the size of the photosensor in accordance with spatial location of a pixel in the array. Accordingly, when the discussion herein refers to changes in the size of the pixel, it is understood that the size of the photosensor changes proportionately to the change in the pixel size. FIG. 4, for example, shows an embodiment that may be used to correct lens shading in which a smaller pixel 210 with a proportionately smaller photosensor 221 may be located near the optical axis of a pixel array, and a larger pixel 310 with a proportionately larger photosensor 321 may be located farther away from the optical axis. Alternatively, the size of the photosensor could be changed in accordance with spatial location while keeping the overall size of the pixels constant.

In one embodiment, the pixels may be arranged in the pixel array in a rectilinear grid. The pixels may be generally rectangular in shape or may comprise various other shapes. The size of the pixels and thus the size of the photosensor may be increased according to the distance of the pixels from the optical axis in the x-direction and/or the y-direction. This allows for differently sized pixels according to their geographic location, while maintaining a rectilinear pixel array. Furthermore, lines connecting the pixels to appropriate circuitry may be formed in straight lines, which may be parallel to the x-axis or the y-axis, and in which simplifies the construction of the pixel array.

Figure 5:
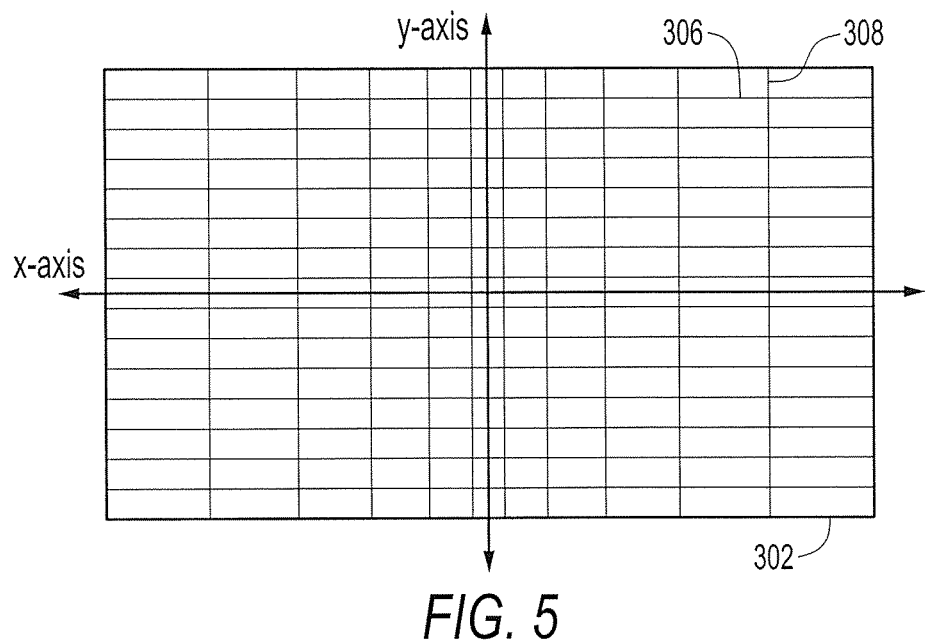
FIG. 5 shows a grid for a pixel array according to an embodiment described herein.
Figure 6:
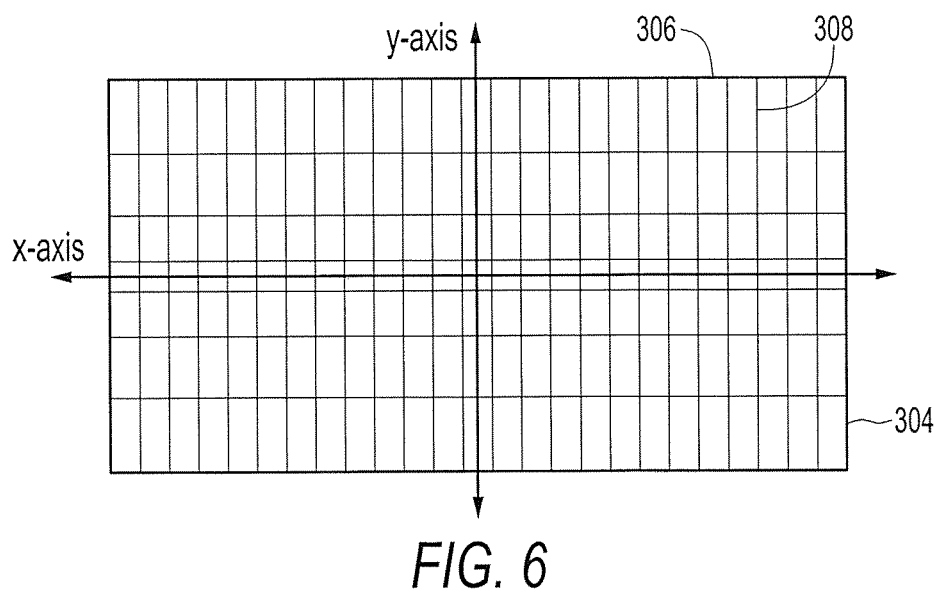
FIG. 6 shows a grid for a pixel array according to an embodiment described herein.
Figure 7:
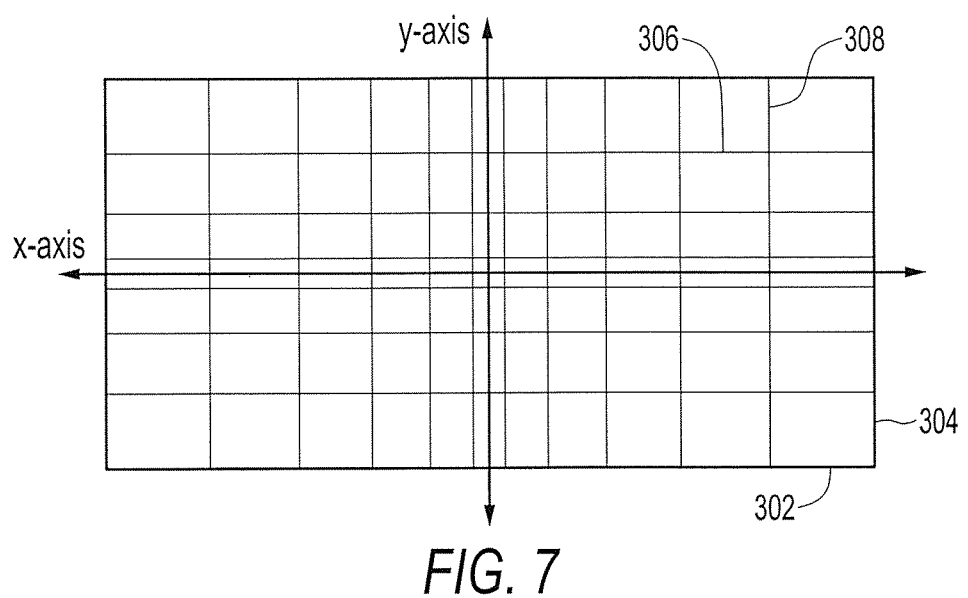
FIG. 7 shows a grid for a pixel array according to an embodiment described herein.
Figure 10:
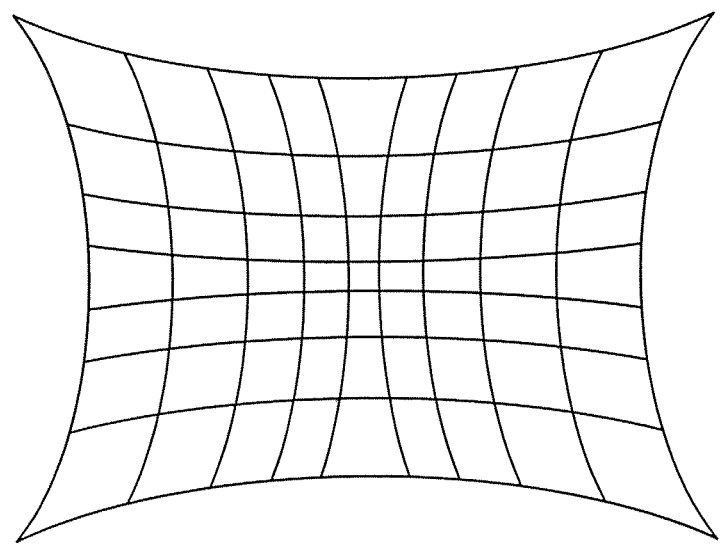
FIG. 10 shows a grid for a pixel array according to an embodiment described herein.

FIG. 5 shows an embodiment in which the length of the sides 302 of the pixels parallel to the x-axis increases according to the distance of the pixels from the y-axis of the pixel array. FIG. 6 shows an embodiment in which the length of the sides 304 of the pixels parallel to the y-axis increases according to the distance of the pixels from the x-axis of the pixel array. FIG. 7 shows an embodiment in which the length of the sides 302 of the pixels parallel to the x-axis increases according to the distance of the pixels from the y-axis of the pixel array and the length of the sides 304 of the pixels parallel to the y-axis increase according to the distance of the pixels from the x-axis of the pixel array. In FIG. 7, it can be seen that the pixels increase in size according to their distance from the center of the pixel array. In another embodiment, the pixels may be curved and may be arranged in a curved pixel array, as illustrated in FIG. 10.

The relationship between the length of the sides of the pixels and the distance from the x-axis and/or y-axis of the pixel array may be determined according to the spatial optical problem to be corrected. As shown in the FIG. 8 embodiment, and as discussed below, to correct lens shading, the length of the sides of the pixels parallel to the x-axis may increase according to the distance of the pixels from the y-axis of the pixel array in accordance with a Gaussian normal distribution curve and/or the length of the sides of the pixels parallel to the y-axis increases according to the distance of the pixels from the x-axis of the pixel array according to a Gaussian normal distribution curve.

Figure 8:
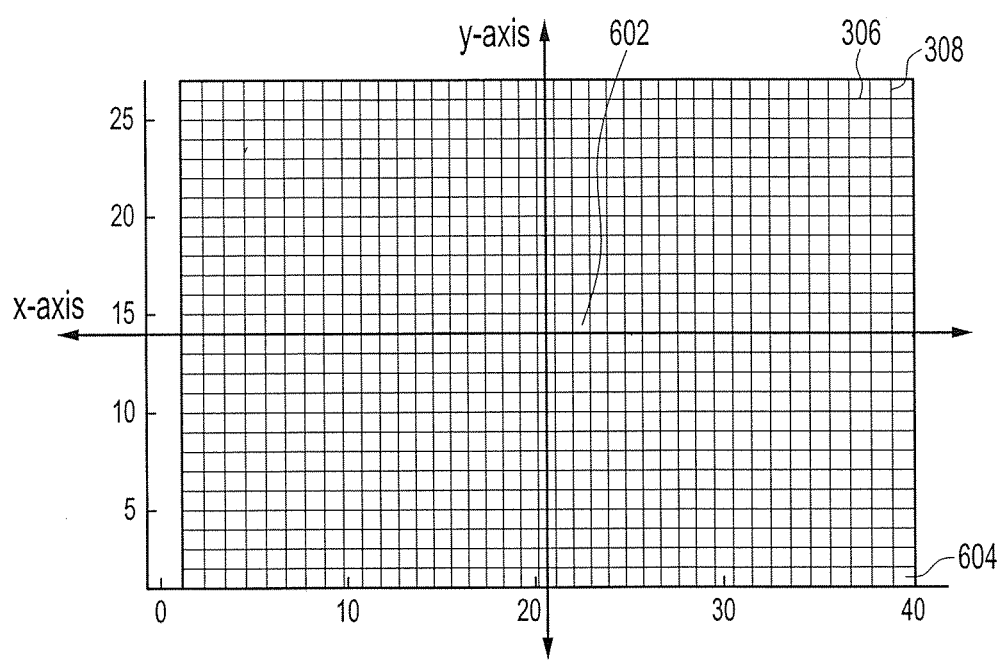
FIG. 8 shows a grid for a pixel array according to an embodiment described herein.

As shown in FIG. 8, The Gaussian normal distribution curve may be the same for the x-axis and the y-axis and thus forming a radially symmetric two dimensional curve. Alternatively, the Gaussian normal distribution curves for the length of the pixel sides parallel to the x-axis and the length of the pixel sides parallel to the y-axis may be different Gaussian normal distribution curves.

Figure 9:
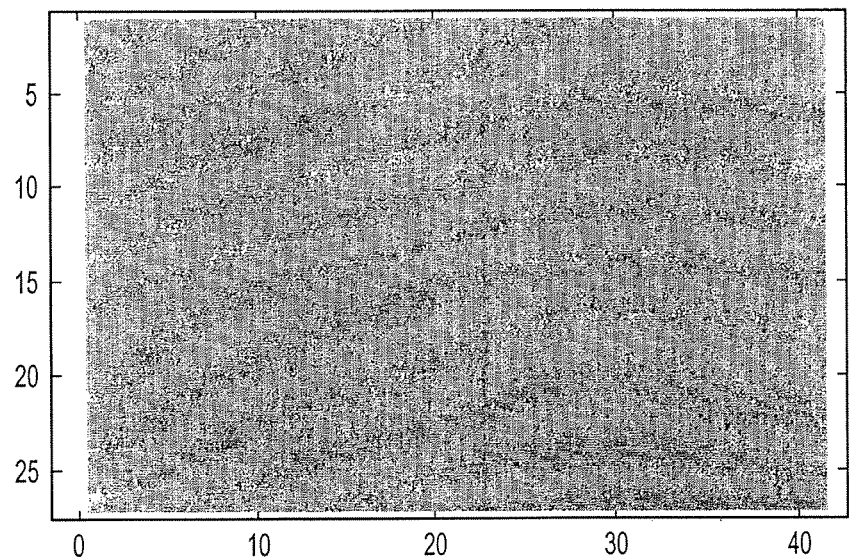
FIG. 9 depicts the amount of light captured and displayed by the pixels of the pixel array of FIG. 8.

FIG. 8 shows an example sampling grid with Gaussian step sizes for the sides of the pixels parallel to the x-axis and the y-axis. In this embodiment, the sides of the pixels parallel to the x-direction are 1.7 microns for the center pixels 602 and are 2.2 microns for the corner pixels 604. FIG. 9 shows the brightness output as a result of the light captured by each pixel in the pixel array. It can be seen from the grid that the brightness does not vary greatly with distance from the center of the pixel array because of the pixel sizing illustrated in FIG. 8.

Figure 11:
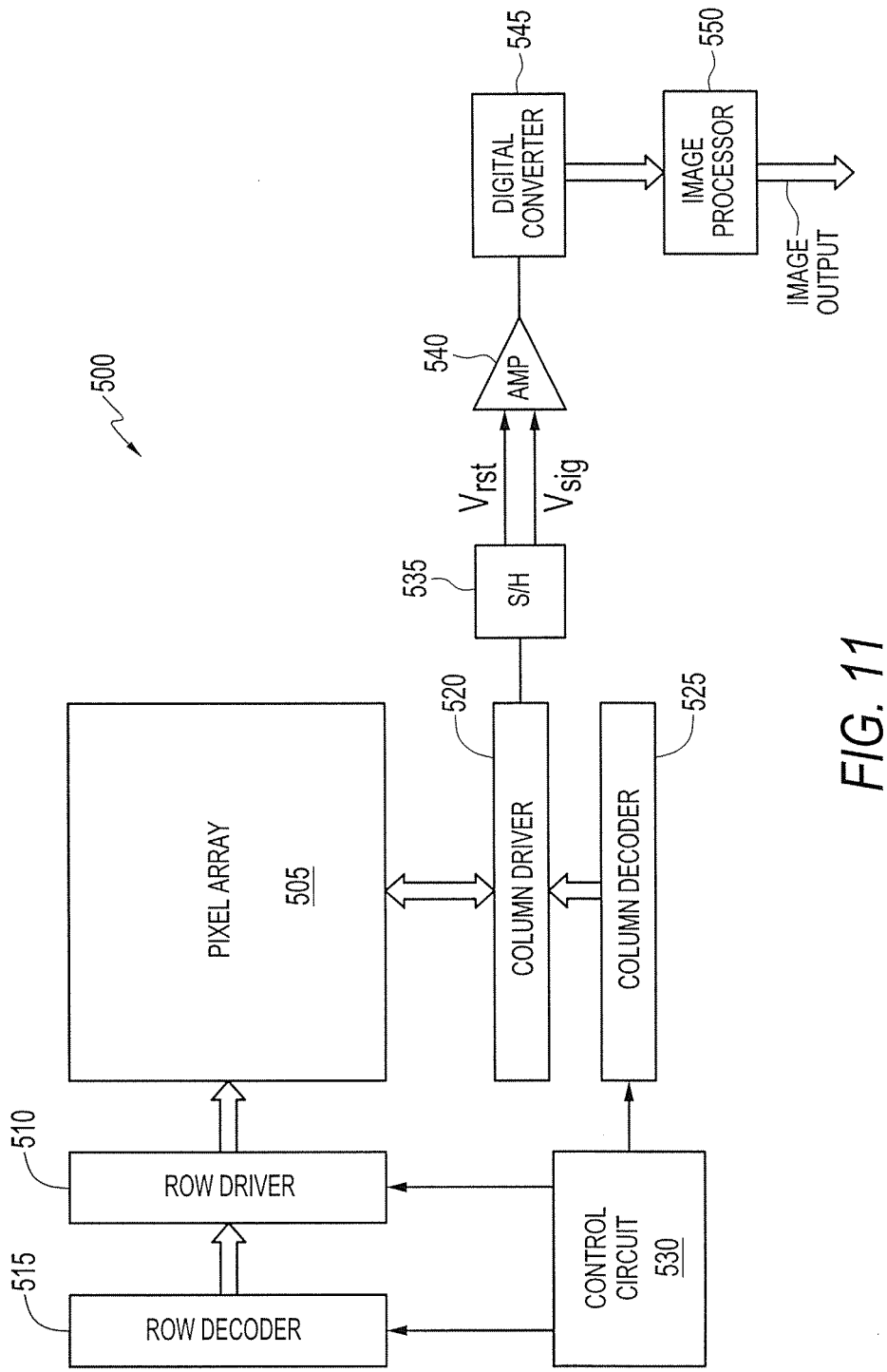
FIG. 11 illustrates a block diagram of a CMOS imaging device constructed in accordance with an embodiment described herein.

For rectilinear pixel layout grids such as those shown in FIGS. 5, 6, 7, and 8, lines 306 (FIGS. 5, 6, 7, and 8) for connecting rows of pixels in the pixel array to circuitry, such as to the row driver 510 shown in FIG. 11, may be arranged substantially parallel to each other and may be spaced apart from each other according to the various pixel sizing schemes. Similarly, lines 308 (FIGS. 5, 6, 7, and 8) for connecting columns of pixels in the pixel array to circuitry, such as the column driver 520 shown in FIG. 11, may be arranged substantially parallel to each other and may be spaced apart from each other according to the various pixel sizing schemes. The lines 306 for connecting rows of pixels in the pixel array to circuitry may be substantially perpendicular to the lines 308 for connecting columns of pixels in the pixel array to circuitry. The fabrication of the pixel array may be simplified by forming the various connecting lines in a rectilinear grid.

Sampling with a non-uniform pixel location grid may create spatial distortion when the signals from the pixels are assembled to form a digital image. For example, the image may appear stretched near the center of the image because the pixels near the center of the image are smaller than the pixels near the edges of the image. One method that may be used to correct the spatial distortion is digital resampling. The spatial distortion may also be corrected using an optical solution, such as using a lens to correct the distortion. Alternatively, if the spatial distortion is small enough, it may be ignored.

As noted, in addition to changing the size of the pixels in order to change the size of the associated photosensors, an embodiment also keeps the pixel size the same throughout the array, but changes the size of the photosensors within the pixels in accordance with a spatial location of the pixels in an array.

FIG. 11 illustrates a block diagram of a CMOS imaging device 500 having a pixel array 505 arranged according to an embodiment described above. The pixels of each row in array 505 are all turned on at the same time by a row select line, and the pixels of each column are selectively output onto the output lines by respective column select lines. A plurality of row and column select lines are provided for the entire array 505. The row lines are selectively activated in sequence by a row driver 510 in response to row address decoder 515. The column select lines are selectively activated in sequence for each row activation by a column driver 520 in response to column address decoder 525. Thus, a row and column address is provided for each pixel.

The CMOS imaging device 500 is operated by a control circuit 530, which controls address decoders 515, 525 for selecting the appropriate row and column select lines for pixel readout. Control circuit 530 also controls the row and column driver circuitry 510, 520 so that they apply driving voltages to the drive transistors of the selected row and column select lines. The pixel output signals typically include a pixel reset signal Vrst read out of the pixel storage region after it is reset by the reset transistor and a pixel image signal Vsig, which is read out of the pixel storage region after photo-generated charges are transferred to the region. The Vrst and Vsig signals are sampled by a sample and hold circuit 535 and are subtracted by a differential amplifier 540, to produce a differential signal Vrst-Vsig for each readout pixel. Vrst-Vsig represents the amount of light impinging on the pixels. This difference signal is digitized by an analog-to-digital converter 545. The digitized pixel signals are fed to an image processor 550 to form a digital image output. The digitizing and image processing can be located on or off the chip containing the pixel array 505. In some arrangements the differential signal Vrst-Vsig can be amplified as a differential signal and directly digitized by a differential analog to digital converter and then fed to image processor 550, which assembles an image for output. Resampling of the image to correct image distortion caused by pixel arrays in accordance with embodiments described herein may also be performed by the image processor 550.

Figure 12:
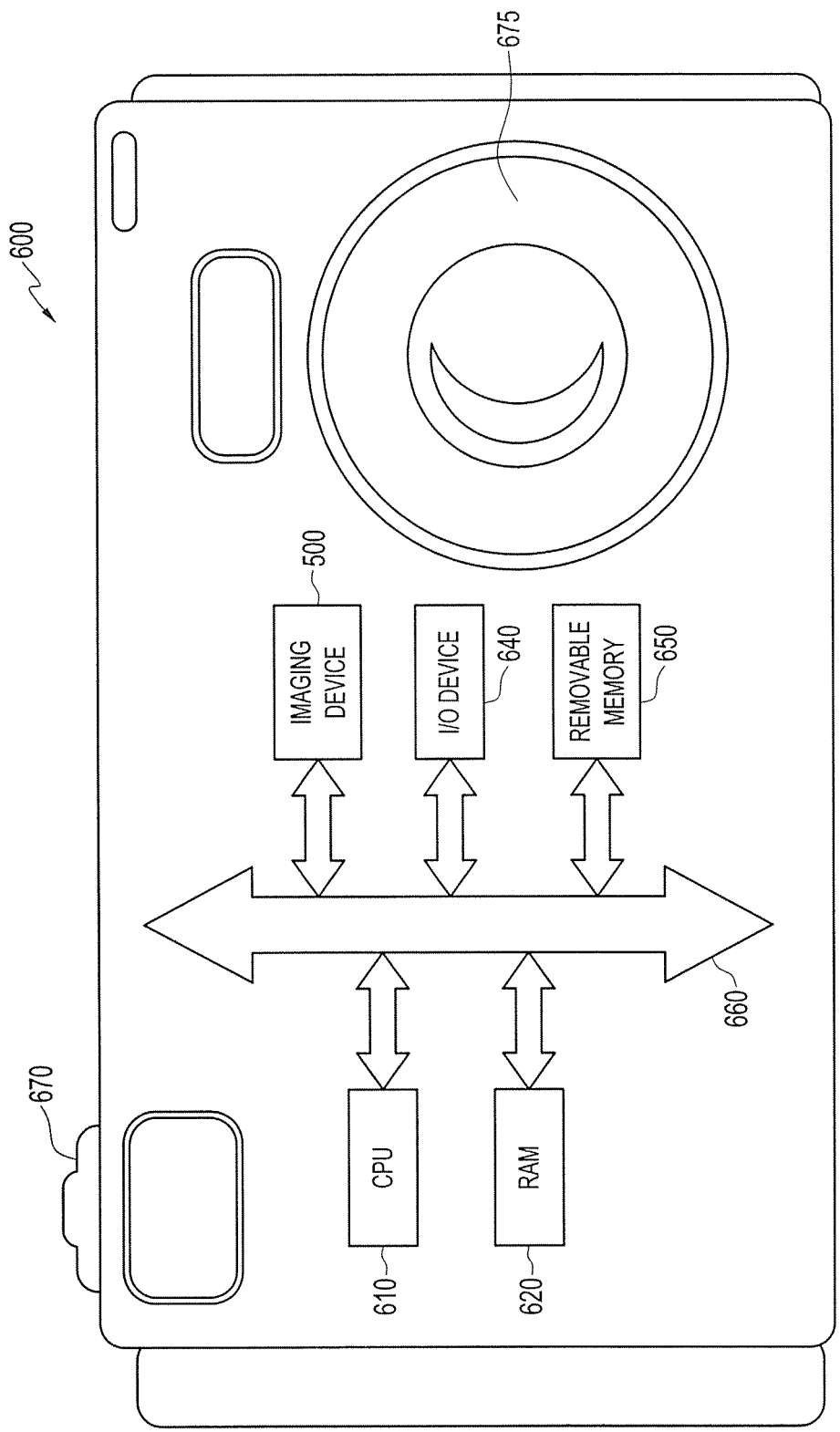
FIG. 12 depicts a processor system, for example, a camera system constructed in accordance with an embodiment described herein.

FIG. 12 shows a processor system 600, for example, a digital camera system, which includes an imaging device 500 constructed to include a pixel array arranged and operated in accordance with an embodiment described herein. The processor system 600 is an example of a system having digital circuits that could include image sensor devices. Without being limiting, in addition to a digital camera system, such a system could include a computer system, scanner, machine vision system, vehicle navigation system, video phone, surveillance system, auto focus system, star tracker system, motion detection system, image stabilization system, and other processing systems employing an imaging device 500.

System 600, for example a camera system, generally comprises a central processing unit (CPU) 610, such as a microprocessor, that communicates with an input/output (I/O) device 640 over a bus 660. Image sensor 630 also communicates with the CPU 610 over the bus 660. The system 600 also includes random access memory (RAM) 620, and can include removable memory 650, such as flash memory, which also communicate with the CPU 610 over the bus 660. Image sensor 630 may be combined with a processor, such as a CPU 610, digital signal processor, or microprocessor, in a single integrated circuit. In a camera, a shutter release button 670 is used to operate a mechanical or electronic shutter to allow light to pass through a lens 675 to the pixel array 505 of imaging device 200.

While embodiments of the invention have been described in detail in connection with embodiments known at the time, it should be readily understood that they are not limited to the disclosed embodiments. Rather, they can be modified to incorporate any number of variations, alterations, substitutions or equivalent arrangements not heretofore described. For example, while embodiments are described in connection with a CMOS pixel imaging device, they can be practiced with any other type of pixel imaging device (e.g., CCD, etc.) or image source. Furthermore, the pixel sizing of the various embodiments could be used in other applications that require modified pixel sizes, such as in a display projector in which bigger pixels located away from the center of the pixel array could be used to correct spatial distortion caused by the projector lens.

In addition, although various embodiments have been described as being useful to correct lens shading, any spatially varying image problem that can be corrected by changing pixel size in relation to pixel distance from a predefined area can be corrected, such as barrel distortion or fish-eye lens. In one embodiment, each row and each column may have an arbitrary scale factor. Furthermore, if certain rows and/or columns of pixels have different characteristics, for example, due to the layout of the lines, transistors, or color filters, the row height or column width may be adjusted accordingly. By modifying the width of the columns and the height of the rows, various sizes of the pixels in the pixel array can be achieved, and the pixel array can include larger or smaller pixels in various places to form a symmetric or asymmetric pattern.

The invention claimed is:

1. An imaging device, comprising:
a pixel array comprising imaging pixels in which pixels located farther from an optical axis of the pixel array have a larger photosensitive area than a photosensitive area of pixels located closer to the optical axis of the pixel array, wherein the phototsensitive area of the pixels increases with distance from the optical axis according to a two dimensional radial Gaussian normal distribution curve.

2. The imaging device of claim 1, wherein the pixel array comprises a rectilinear grid.

3. The imaging device of claim 1, wherein the overall area of each pixel is substantially the same.

4. The imaging device of claim 1, wherein the overall area of the pixels increases with distance from the optical axis and wherein the photosensitive area increases in proportion to the increase in overall area of the pixels.

5. The imaging device of claim 1, wherein said array has an x-axis and a y-axis and wherein a length of a side of the pixels parallel to the x-axis increases according to the distance of the pixels from the y-axis and a length of a side of the pixels parallel to the y-axis increases according to the distance of the pixels from the x-axis.

6. The imaging device of claim 5, wherein the length of the side of the pixels parallel to the x-axis increases according to the distance of the pixels from the y-axis according to a Gaussian normal distribution curve and the length of the side of the pixels parallel to the y-axis increases according to the distance of the pixels from the x-axis according to a Gaussian normal distribution curve.

7. An imaging device, comprising:
a pixel array comprising imaging pixels in which pixels located farther from an optical axis of the pixel array have a larger photosensitive area than a photosensitive area of pixels located closer to the optical axis of the pixel array,
wherein the pixel array has an x-axis and a y-axis, and
wherein a length of a side of the pixels parallel to the x-axis increases according to the distance of the pixels from the y-axis and a length of a side of the pixels parallel to the y-axis remains constant for all pixels of the pixel array.

8. The imaging device of claim 7, wherein the length of the side of the pixels parallel to the x-axis increases according to the distance of the pixels from the y-axis according to a Gaussian normal distribution curve.

9. An imaging device, comprising:
a pixel array comprising imaging pixels in which pixels located farther from an optical axis of the pixel array have a larger photosensitive area than a photosensitive area of pixels located closer to the optical axis of the pixel array,
wherein the pixel array has an x-axis and a y-axis, and
wherein a length of a side of the pixels parallel to the y-axis increases according to the distance of the pixels from the x-axis and a length of a side of the pixels parallel to the x-axis remains constant for all pixels of the pixel array.

10. The imaging device of claim 9, wherein the length of the side of the pixels parallel to the y-axis increases according to the distance of the pixels from the x-axis according to a Gaussian normal distribution curve.

11. An imaging processing system comprising:
   a processor;
   a pixel array; and
   an optical system for delivering an image to said pixel array, said optical system providing less light to photosensors of pixels near a periphery of said array than to photosensors of pixels near a center of said array;
   wherein said photosensors of said pixels near a periphery of said array are larger than photosensors of said pixels near a center of said array; and
   wherein the photosensors of the pixels increases with distance from the optical axis according to a two dimensional radial Gaussian normal distribution curve.

12. The image processing system of claim 11, wherein said array has an x-axis and a y-axis and wherein a length of a side of the pixels parallel to the x-axis increases according to the distance of the pixels from the y-axis and the length of the sides of the pixels parallel to the y-axis increases according to the distance of the pixels from the x-axis.

13. The image processing system of claim 12, wherein the length of the side of the pixels parallel to the x-axis increases according to the distance of the pixels from the y-axis according to a Gaussian normal distribution curve and the length of the side of the pixels parallel to the y-axis increase according to the distance of the pixels from the x-axis according to a Gaussian normal distribution curve.

14. The image processing system of claim 11, further comprising a row driver and a column driver, wherein lines connecting rows of pixels to the row driver are parallel to each other, and wherein lines connecting columns of pixels to the column driver are parallel to each other.

15. A method of manufacturing an imaging device comprising:
   forming a pixel array comprising imaging pixels in which pixels located farther from an optical axis of the pixel array have a larger photosensitive area than a photosensitive area of pixels located closer to the optical axis of the pixel array; and
   wherein the photosensitive area of the pixels are formed so that they increase with distance from the optical axis according to a two dimensional radial Gaussian normal distibution curve.

16. The method of claim 15, wherein said array has an x-axis and a y-axis and wherein a length of a side of the pixels parallel to the x-axis is formed to increase according to the distance of the pixels from the y-axis and the length of a side of the pixels parallel to the y-axis is formed to increase according to the distance of the pixels from the x-axis.

17. The method of claim 16, wherein the length of the side of the pixels parallel to the x-axis is formed to increase according to the distance of the pixels from the y-axis according to a Gaussian normal distribution curve and the length of the side of the pixels parallel to the y-axis is formed to increase according to the distance of the pixels from the x-axis according to a Gaussian normal distribution curve.

18. The method of claim 15, wherein the photosensitive areas of the pixels are formed to increase in proportion to an increase in total area of the pixels.

* * * * *

UNITED STATES PATENT AND TRADEMARK OFFICE
CERTIFICATE OF CORRECTION

PATENT NO. : 8,502,898 B2
APPLICATION NO. : 11/739010
DATED : August 6, 2013
INVENTOR(S) : Amnon Silverstein It is certified that error appears in the above-identified patent and that said Letters Patent is hereby corrected as shown below:

In the Claims

In column 6, line 17, in Claim 1, delete "phototsensitive" and insert -- photosensitive --, therefor.

In column 8, line 12, in Claim 15, delete "area" and insert -- areas --, therefor.

In column 8, line 15, in Claim 15, delete "distibution" and insert -- distribution --, therefor.

Signed and Sealed this
Twenty-ninth Day of October, 2013

Teresa Stanek Rea
*Deputy Director of the United States Patent and Trademark Office*